United States Patent [19]

Mori et al.

[11] Patent Number: 5,321,453
[45] Date of Patent: Jun. 14, 1994

[54] PROBE APPARATUS FOR PROBING AN OBJECT HELD ABOVE THE PROBE CARD

[75] Inventors: Shigeoki Mori, Ayase; Wataru Karasawa, Yokohama, both of Japan

[73] Assignee: Tokyo Electron Limited, Tokyo, Japan

[21] Appl. No.: 923,539

[22] Filed: Aug. 3, 1992

[30] Foreign Application Priority Data

| Aug. 3, 1991 | [JP] | Japan | 3-216648 |
| Aug. 3, 1991 | [JP] | Japan | 3-216649 |
| Aug. 3, 1991 | [JP] | Japan | 3-216650 |
| Sep. 5, 1991 | [JP] | Japan | 3-254638 |

[51] Int. Cl.$^5$ .......................... G01R 31/02
[52] U.S. Cl. .................. 324/158 P; 324/158 F
[58] Field of Search ........... 324/72.5, 158 P, 158 F; 33/533, 573; 439/482

[56] References Cited

U.S. PATENT DOCUMENTS

| 4,017,793 | 4/1977 | Haines | 324/158 F |
| 4,201,939 | 5/1980 | Lee et al. | 324/158 P |
| 4,589,815 | 5/1986 | Smith | 324/158 F |
| 4,626,780 | 12/1986 | Powers | 324/158 F |
| 4,751,457 | 6/1988 | Veenendaal | 324/158 F |
| 4,757,255 | 7/1988 | Margozzi | 324/158 F |
| 4,786,867 | 11/1988 | Yamatsu | 324/158 F |
| 4,864,227 | 9/1989 | Sato | 324/158 P |
| 4,929,893 | 5/1990 | Sato et al. | 324/158 F |
| 4,943,767 | 7/1990 | Yokota | 324/158 F |
| 4,982,153 | 1/1991 | Collins et al. | 324/158 P |
| 5,077,523 | 12/1991 | Blanz | 324/158 F |
| 5,084,671 | 1/1992 | Miyata et al. | 324/72.5 |
| 5,124,644 | 6/1992 | Ganapol | 324/158 F |

*Primary Examiner*—Vinh Nguyen
*Attorney, Agent, or Firm*—Oblon, Spivak, McClelland, Maier & Neustadt

[57] ABSTRACT

A probe apparatus having a probe card having plurality of probes, a member arranged above the probe card to hold an object to be probed, and a test head electrically connected to the probes of the probe card.

10 Claims, 7 Drawing Sheets

PROBE APPARATUS FOR PROBING AN OBJECT HELD ABOVE THE PROBE CARD

BACKGROUND OF THE INVENTION

1. Field of the Invention

The present invention relates to a probe apparatus and, more particularly, it relates to a probe apparatus for examining electric characteristics of objects such as semiconductor wafers while contacting probes of the probe apparatus with electrode pads of each of the wafers.

2. Description of the Related Art

The probe apparatus has been well-known as means for examining electric characteristics of objects such as semiconductor wafers.

Figure 1:
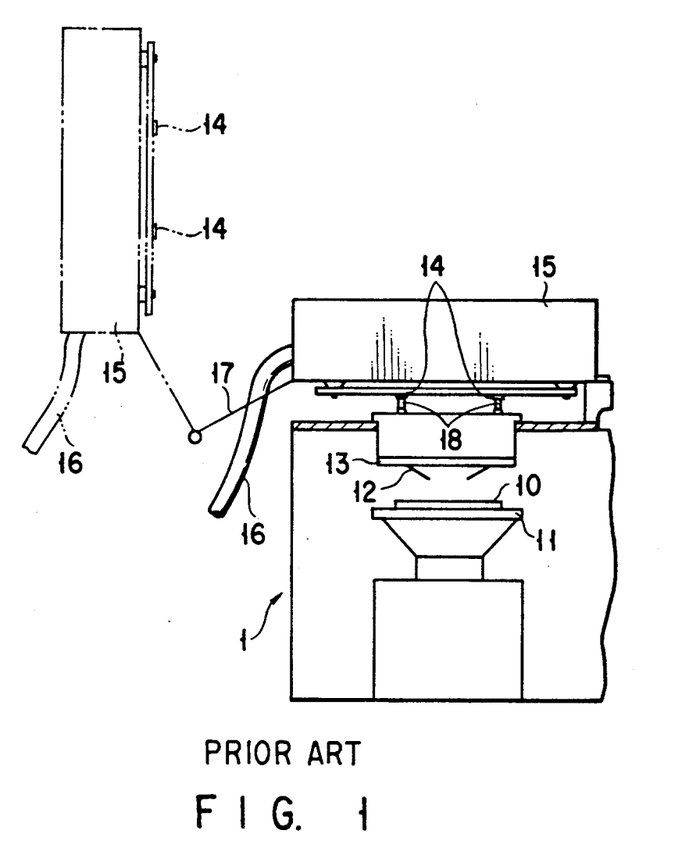
FIG. 1 is a view schematically showing the conventional probe apparatus.

One of the conventional probe apparatuses of this type has such an arrangement as shown in FIG. 1. More specifically, it comprises a table 11 attached to an apparatus body 1, which can be moved in horizontal and vertical directions, and on which a wafer 10 is mounted, a probe card 13 arranged above the wafer-mounted table 11 and provided with probes 12 which are contacted with electrode pads of the wafer 10, and a test head 15 contacted with contact elements 18 on the top of the probe card 13 through input/output pins 14 to convert electric signals applied from the probe card 13. The test head 15 is connected to measuring equipment located outside through a plurality of wirings in a cable 16. Hinges 17 are attached to the test head 15 to enable the latter to be swung in those directions which are shown by arrows in FIG. 1. A manipulator (not shown) is attached to one side of the apparatus body 1 to move up and down the probe card 13 and the test head 15 as a unit.

When electric characteristics of the wafer 10 are to be examined by the above-arranged probe apparatus, the test head 15 is moved and set relative to the top of the probe card 13. Electrode pads of the wafer 10 on the wafer-mounted table 11 are aligned with probes of the probe card 13 by an alignment device (not shown). The probe card 13 is moved downward together with the test head 15 to contact the probes 12 of the probe card 13 with the electrode pads of the wafer 10. Electric characteristics of the wafer 10 are thus examined.

In the case of this probe apparatus, however, the number of input/output pins must be increased and the wiring must be made more complicated as the number of electrodes of the wafer is increased. This makes the test head 15 extremely heavy such as 800 kg, for example. In addition, the diameter of the cable 16 through which the test head 15 is connected to the external measuring equipment must be made larger. The structure of the apparatus body 1 must also be made more rigid to make stronger the hinge system by which the test head 15 is swung. Therefore, the probe apparatus becomes largersized. Further, there is a possibility that wirings in the cable must be broken because the diameter of the cable becomes larger and because more excessive load is thus added to the cable when the test head 15 is to be swung.

In the case of the above-arranged probe apparatus, too, it cannot be avoided that the cable through which the test head 15 is connected to the external measuring equipment becomes longer. When electric characteristics of objects such as semiconductor wafers are to be examined, it is usually preferable that the examination is carried out using a frequency substantially equal to or near that of signals applied from the objects to be examined. When the cable is long, however, signal delay of about 1 nsec is caused per 10 cm of the cable. Therefore, the examination cannot be carried out at a high frequency of about 500 MHz. The above-arranged probe apparatus was not satisfactory in this point when it was used to examine such semiconductor chips that must meet high speed for super computers.

Figure 2:
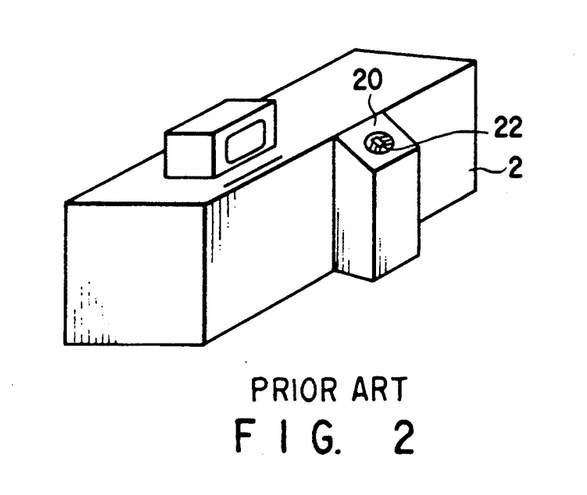
FIG. 2 is a view schematically showing the conventional tester.

Another tester comprising a tester body 2 provided with the measuring equipment and a test head 20 combined with the tester body 2, as shown in FIG. 2, is wellknown. In the case of this tester, the cable through which the test head 20 is connected to the measuring equipment is shorter, as compared with the abovementioned one. This can prevent signal delay from being caused.

However, this tester takes a longer time for measurement because the measuring person must examine a semiconductor chip 22 after it is manually picked up from its packaged cassette and must manually return it to the cassette after the examination is finished. This makes it impossible to examine a large number of matters with high efficiency.

SUMMARY OF THE INVENTION

The object of the present invention is therefore to provide a probe apparatus capable of examining electric characteristics of matters without swinging the heavy test head.

This object can be achieved by a probe apparatus comprising a probe card having a plurality of probes, object holder member arranged above the probe card to hold an object to be examined, and a tester head electrically connected to probes of the probe card.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 3:
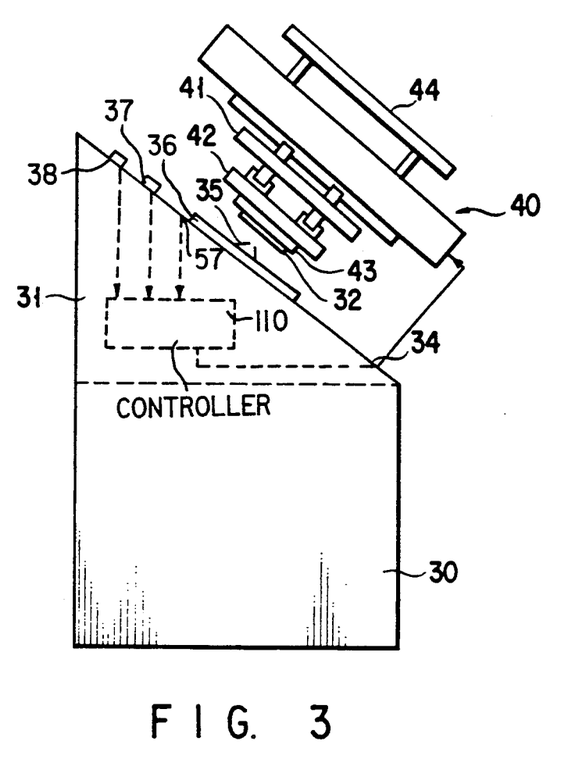
FIG. 3 is a view schematically showing the probe apparatus according to an embodiment of the present invention.

FIG. 3 schematically shows the probe apparatus according to an embodiment of the present invention. Reference numeral 30 in FIG. 3 represents a tester. A test head 31 is attached integral to the tester 30. A performance system including a power source for applying power to a semiconductor wafer 32, electric equipment for sending output information applied from electrode pads of chips on the semiconductor wafer 32, which is to be probed, to the measuring equipment, a relay for changing over electric connection between a probe 35 and a test head body, an accuracy-adjusting capacitor, and others are housed in the test head 31. A measuring face 34 of the test head 31 is tilted by a certain angle of 45°, for example, relative to the horizontal plane. A probe card 36 having probes 35 is positioned on the measuring face 34 substantially at the center thereof. Probes 35 having a number equal to that of electrode pads of the semiconductor wafer 32, that is, several hundred probes 35 are attached to the probe card 36 so as to exchange electric signals between the semiconductor wafer 32 and the test head 31.

Figure 4:
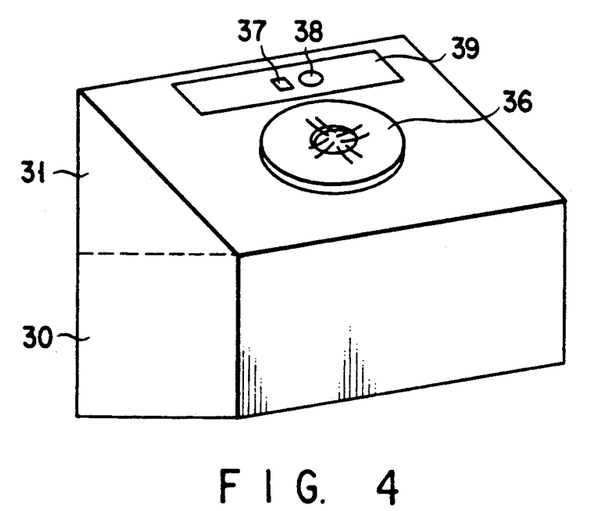
FIG. 4 is a view schematically showing a tester according to the present invention.

As shown in FIG. 4, an alignment device 39 including a TV camera 37 for detecting positions of chips on the semiconductor wafer 32, and a capacitance sensor 38 for detecting the position of the semiconductor wafer 32 in an axis direction Z is arranged on the measuring face 34 of the test head 31.

On the other hand, an object holder member 40 attached to drive means (not shown) is arranged above the test head 31. A Y-stage 41 is mounted on the object holder member 40 and an X-stage 42 is then mounted on the Y-stage 41. Further, a wafer chuck 43 is mounted on the X-stage 42, chucking the semiconductor wafer 32 thereon. The object holder member 40 is tilted relative to the horizontal plane by a certain angle so as to correspond to the tilted measuring face 34 of the test head 31. Further, an angle adjusting system 44 is attached to the object holder member 40, thereby enabling the object holder member 40 to correspond to any of the measuring faces which are variously tilted relative to the horizontal plane.

Figure 5:
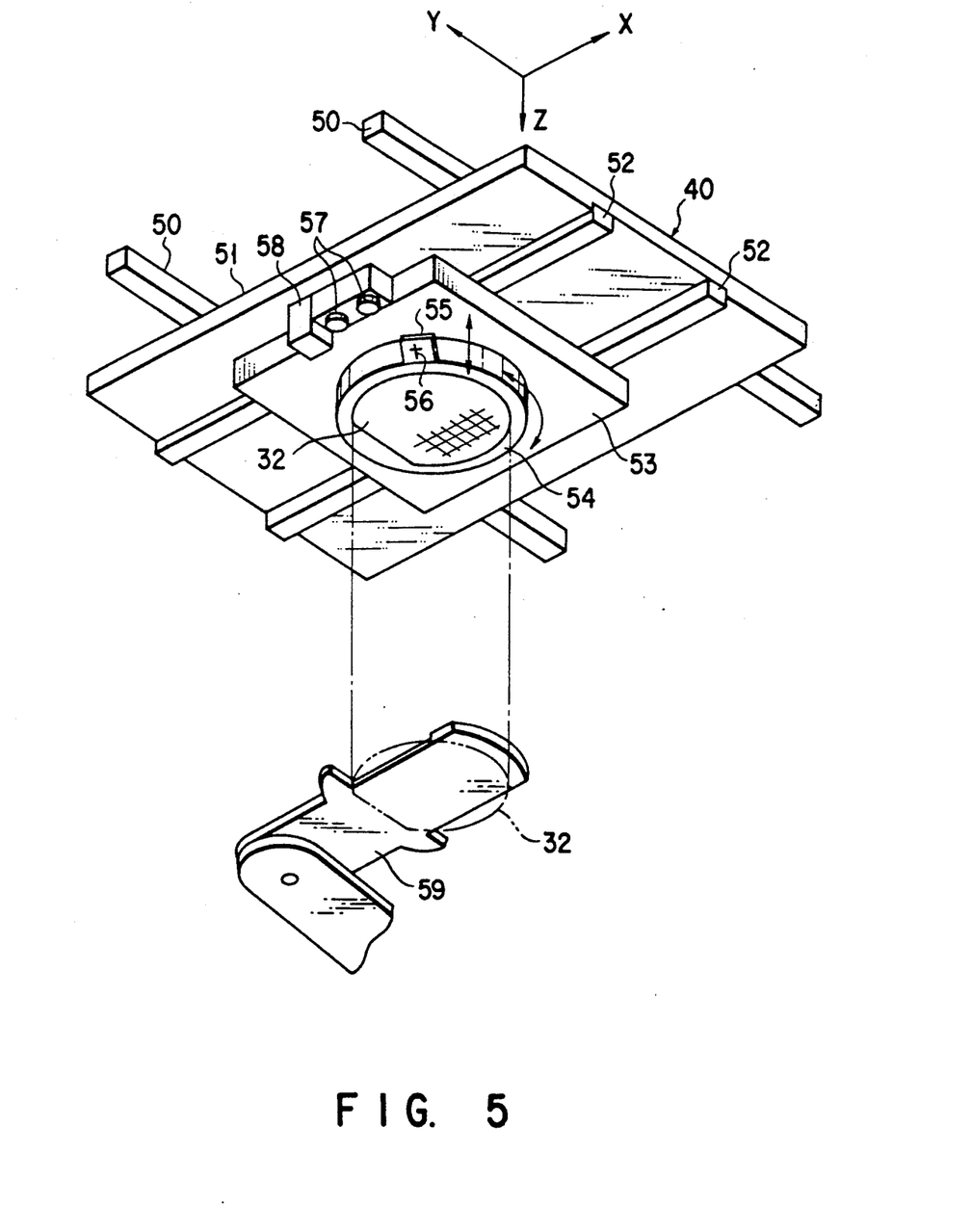
FIG. 5 is a perspective view showing an object holder member by which an object to be examined is held.

As shown in FIG. 5, the object holder member 40 comprises a Y-stage 51 freely slidable on guide rails 50 which extend in a direction Y, an X-stage 53 freely slidable on guide rails 52 which extend on the Y-stage 51 in a direction X, and a chuck 54 movable up and down (or in a direction Z) and rotatable in relation to the X-stage 53. The chuck 54 includes sucking means (not shown) to suck and hold the semiconductor wafer 32 thereon.

A reference position member 55 is projected from the side of the chuck 54. This reference position member 55 is a piece of glass used as a transparent electrode for the liquid crystal and provided with a cross reference mark 56 made of Cr at the center thereof. Position detector cameras 57 are attached to one side of the X-stage 53 to detect positions of the probes 35 of the probe card 36 in the directions X and Y and also to detect the position of the reference mark 56 of the reference position member 55 in the direction Z. These position detector cameras 57 can be switched from high to low magnification and vice versa. A drive means 58 is arranged on one side of the position detector cameras 57 to drive them in the direction Z. The object holder member 40 can be moved as a whole in the horizontal direction by a drive system (not shown). In the case of the above-arranged object holder member 40, the semiconductor wafer 32 is picked up from a cassette (not shown) and carried under the chuck 54 by a carrying arm 59 and then sucked by the chuck 54. The semiconductor wafer 32 is thus held by the object holder member 40.

When a semiconductor chip and probes are to be positioned to one another, probe traces of the semiconductor chip are detected by the TV camera 37 shown in FIG. 4 to confirm the position of the semiconductor chip. Positional information of this semiconductor chip is compared with that of the probes detected from the side of the semiconductor wafer by the position detector cameras 57, and then arithmetically calculated by a control means 110 (not shown) so as to allow the probes to be contacted with electrode pads of the semiconductor chip. The position of the reference mark 56 of the reference position member 55 in the direction Z detected by the capacitance sensor 38 is also similarly compared with that of the reference mark 56 in the direction Z detected by the position detector cameras 57, and then arithmetically calculated by the control means so as to correct the positional shift of the semiconductor wafer which is caused by expansion of members and other causes. As shown in FIG. 3, the control means 110 receives the signals produced by the position detector cameras 57, the TV camera 37 and the capacitance sensor 38 in order to calculate the necessary positioning arrangement between the probe card 36 and the object holder 40. After making this calculation, the controller 110 outputs a signal to the object holder 40 in order to control the same so that it can move into proper position and appropriately contact the semiconductor wafer 32 with the probes 35 of the probe card 36.

Figure 6:
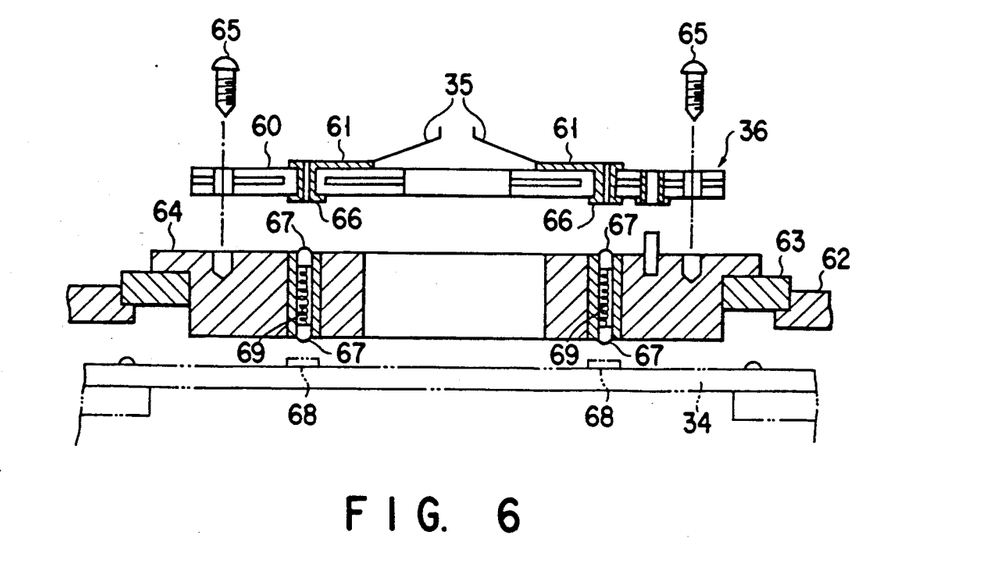
FIG. 6 is a view schematically showing attachments for a probe card.

The fixing of the probe card 36 to the test head 31 is carried out as follows. As shown in FIG. 6, a plurality of probes 35 are attached to the body of the probe card 36 so as to connect with a conductive section 61 formed on a printed circuit board 60. A head plate 62 is attached to the measuring face 34 of the test head 31 and a holder member 64 is attached to the head plate 62 through an insert ring 63. The body of the probe card 36 is then attached to the holder member 64 by fixing screws 65. The probe card 36 is thus fixed to the test head 31. When the probe card 36 is fixed to the test head 31 in this manner, earth potential supply pads 66 connected to the conductive section 61 of the probe card 36 are electrically connected to one end of each of input/output pins 67. These input/output pins 67 are electrically connected to contact elements 68 of the test head 31 at the other ends thereof, passing through holes in the holder member 64. A compression spring 69 is housed in each of the input/output pins 67 to establish reliable connection between the earth potential supply pads 66 and the contact elements 68. Electric signals can be thus exchanged between the probes 35 of the probe card 36 and the test head 31.

It will be now described how the above-arranged probe apparatus is operated.

Figure 7:
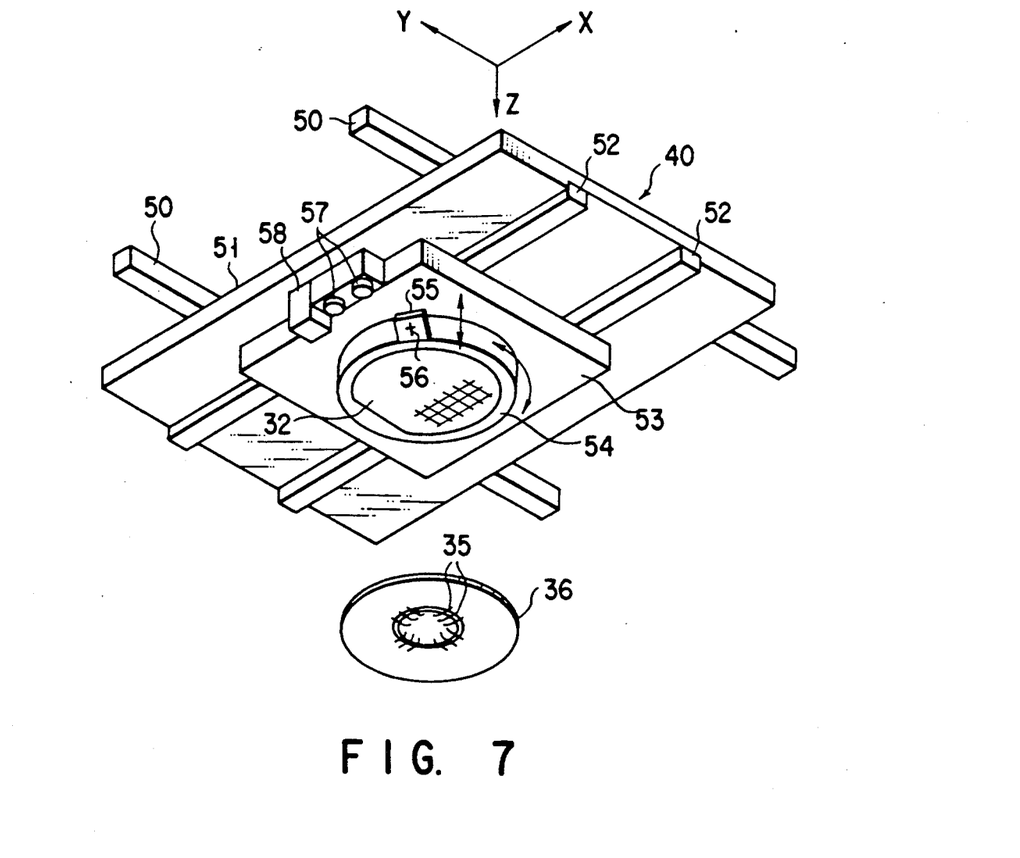
FIG. 7 is a view schematically showing the relation of the object to be probed to the probe card.

The semiconductor wafer 32 which is a matter to be examined is sucked and held by the chuck 54 of the object holder member 40, as shown in FIG. 7. The chuck 54 is then moved oppose to the alignment device 39 and the position of a chip of the semiconductor wafer 32 is detected by the TV camera 37 of the alignment device 39 on the test head 31. This image information thus detected is stored and compared with those of patterns of the second and following semiconductor wafers to position them. The semiconductor wafer 32 thus positioned by the alignment device 39 is opposed, while being held by the chuck 54, to the probe card 36 with a clearance between them.

The chuck 54 is then moved in the directions X, Y and Z responsive to the positional information of the probes 35 previously confirmed by the position detector cameras 57 of the object holder member 40. The positioning of the probes 35 of the probe card 36 relative to their corresponding electrode pads of the chip of the semiconductor wafer 32 is thus finished and electric characteristics of the semiconductor wafer can be therefore measured while contacting the probes 35 with their corresponding electrode pads.

Measuring electric signals are transmitted in this case among the tester 30, the test head 31, the probe card 36, the probes 35 and the chips of the semiconductor wafer 32. According to the present invention, the test head 31 is attached directly to the tester 30. The cable connecting the head to the tester can be made shorter, accordingly. This can prevent electric signals from being delayed. As a result, the characteristics examination can be carried out at a higher frequency. In addition, the cable is not exposed outside, thereby preventing it from being damaged.

After the characteristics examination relating to one chip of the semiconductor wafer 32 is finished in this manner, the semiconductor wafer 32 is moved using the X- and Y-stages 51 and 53 and electrode pads of a next chip on the semiconductor wafer 32 are positioned relative to their corresponding probes. The characteristics examination of the chip on the semiconductor wafer 32 is then conducted and this process is successively repeated for the to remaining chips on the semiconductor wafer 32. When the characteristics examination relating to one semiconductor wafer is finished in this manner, the object holder member 40 is moved or slid in the traverse direction, for example, and the semiconductor wafer which has been examined is exchanged with a new one. The same characteristics examination as described above will be conducted for this new semiconductor wafer.

According to the probe apparatus of the present invention, the test head 31 is made integral with the tester 30 and its measuring face 34 is tilted relative to the horizontal plane. This makes it unnecessary to use the hinge system, which was needed for the conven-tional probe apparatuses, thereby making the probe apparatus of the present invention miniaturized.

Another example of the probe apparatus according to the present invention will be described.

Figure 8:
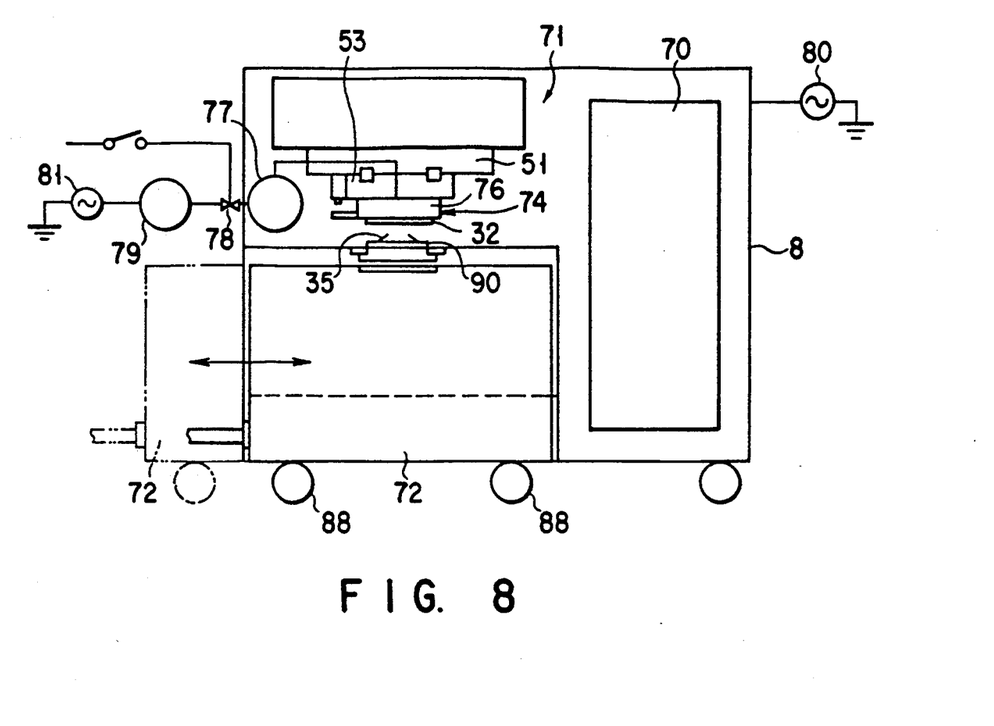
FIGS. 8 through 11 are views schematically showing the probe apparatus according to another embodiment of the present invention, in which FIG. 9 schematically shows loader and probe sections of the probe apparatus shown in FIG. 8, and FIG. 10 schematically shows an example of the sucking means of the probe apparatus shown in FIG. 8.
Figure 9:
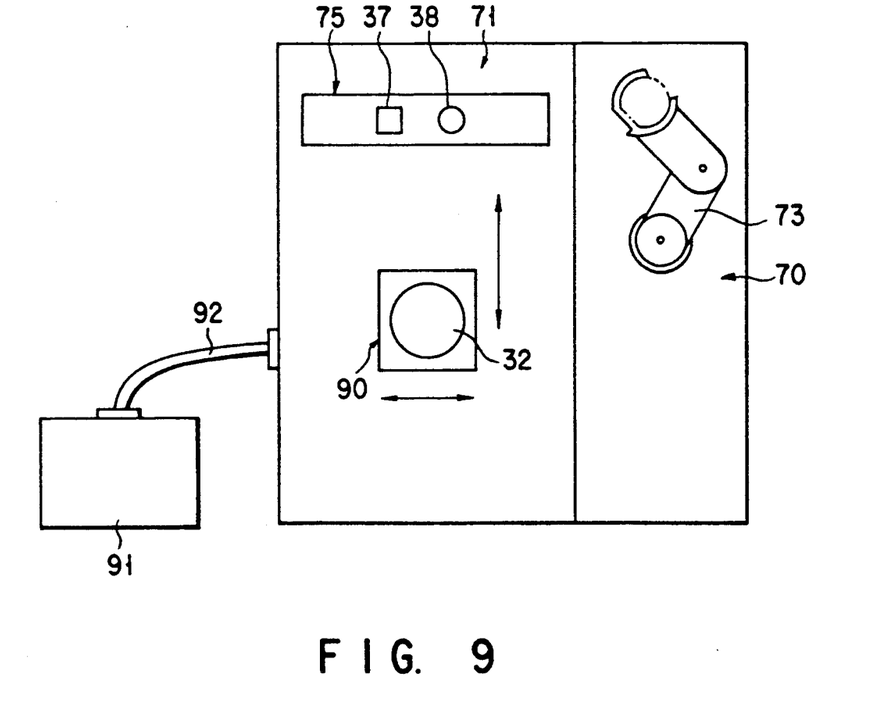

As shown in FIG. 8, this other probe apparatus comprises a loader section 70 for carrying semiconductor wafers, which are objects to be examined, into and out of the apparatus, a probing section 71 located by the loader section 70, and a test head 72 movable into and out of a space under the probing section 71. A carrying arm 73 is attached to the loader section 70, as shown in FIG. 9. This carrying arm 73 is a multi-jointed link system rotatable on the horizontal plane and movable in the vertical direction. It can therefore carry the semiconductor wafer between the cassette (not shown), in which a plurality of semiconductor wafers are housed, and the probing section 71.

Figure 10:
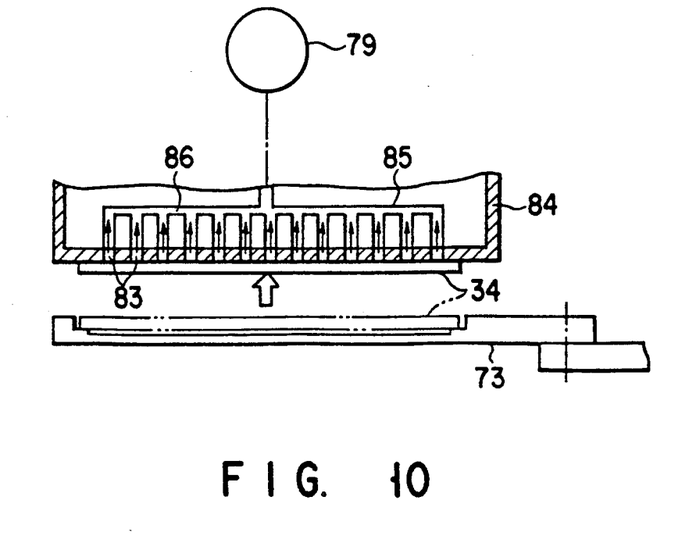

The probing section 71 includes an object holder member 74 for holding an object to be examined, an alignment device 75, and a probe card 90, as shown in FIG. 9. The object holder member 74, the alignment device 75 and the probe card 90 are arranged in the same manner as described above. A vacuum pump 79 is connected to a chuck 76 of the object holder member 74 via a tank 77 and an electromagnetic valve 78, as shown in FIG. 8 (interlock system). The vacuum pump 79 is also connected to a power source 81 different from a main power source 80 used for the probe apparatus 8. When the power source 81 is used in this manner, the dropping of the semiconductor wafer, which is sucked and held by the chuck 76, can be prevented even if the main power source 80 is switched off. The electromagnetic valve 78 is connected to an emergency power source 82 and even when the main power source 80 and the power source 81 are stopped by power stoppage, for example, therefore, the semiconductor wafer sucked and held by the chuck 76 can be prevented from dropping. In short, the electromagnetic valve 78 is closed at the time of power stoppage to keep the tank 77 as a vacuum and the semiconductor wafer can be sucked and held by the chuck 76 through the tank 77 thus kept as a vacuum. The electromagnetic valve 78 is opened at the usual time and the semiconductor wafer is sucked and held by the chuck 76 through the vacuum pump 79. The chuck 76 comprises a chuck body 84 having a plurality of holes 83 in the underside thereof, and flexible pipe passages 86 arranged in a hollow portion 85 in the chuck body 84, as shown in FIG. 10. When the semiconductor wafer 32 is to be sucked and held by the chuck 76, therefore, it is carried under the chuck 76 by the carrying arm 73 and that face of it which is opposed to its probed face as then contacted with the underside of the chuck body 84. The vacuum pump 79 is then made operative to make the hollow portion 85 of the chuck body 84 pressure-reduced. The semiconductor wafer 32 can be thus sucked and held by the chuck 76.

The test head 72 is shaped like a box, as shown in FIG. 8. It includes a probing power source for applying voltage to the semiconductor wafer, electric equipment for causing input and output to be transmitted between the measuring equipment and electrode pads, and others. A connecting section 87 is formed on the top of the test head 72 and it can be contacted with an input/output section of a probe card 90. It is preferable that a height adjusting system (not shown) is attached to the test head 72 to reliably contact the connecting section 87 with the input/output section of the probe card 90.

Further, casters 88 are attached to the underside of the test head 72, so that the test head 72 can be easily moved. The test head 72 may run on guide rails, for example. The test head 72 is connected to tester 91, which is located outside the probe apparatus, through a cable 92.

In the case of the above-arranged probe apparatus, too, electric characteristics of the semiconductor wafer can be examined in the same manner as described above. The second probe apparatus is set upside down in this case, as compared with the conventional one. In short, the semiconductor wafer which is an object to be examined is positioned just above the probe card. The chuck 76, however, has the above-described sucking system. The semiconductor wafer can be thus reliably prevented from dropping off the chuck 76 and electric characteristics of the semiconductor wafer can be excellently examined even in this case.

Figure 11:
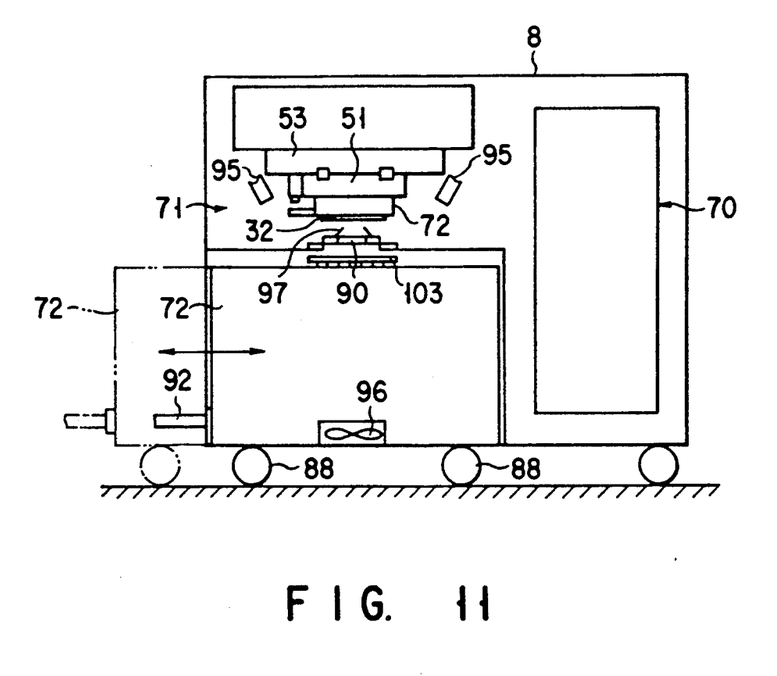

As shown in FIG. 11, it may be arranged in the second probe apparatus that gas supply nozzles 95 are arranged on both sides of the probing section 71 and that a fan 96 is arranged on the bottom of the test head 72. When arranged in this manner, oxide film pieces cut off from electrode pad surfaces by probes 97 and fine particles entering from outside into the probe apparatus at the probing time can be eliminated.

The test head which is opposed to the probe card provided with a plurality of probes has a large heat value. Therefore, there is a possibility that the probe card above the test head is heated by the convection of heat. When down flow is created by clean air and N₂ gas of low temperature, however, it can be prevented that temperatures of the semiconductor wafer and the probe card are raised. Cooled gas is introduced (in directions A), in this case, through the supply nozzles 95 at the examining time. The gas thus introduced flows from the probing section of the probe apparatus into the test head and it is then exhausted outside from the bottom of the test head by the fan 96.

Figure 12:
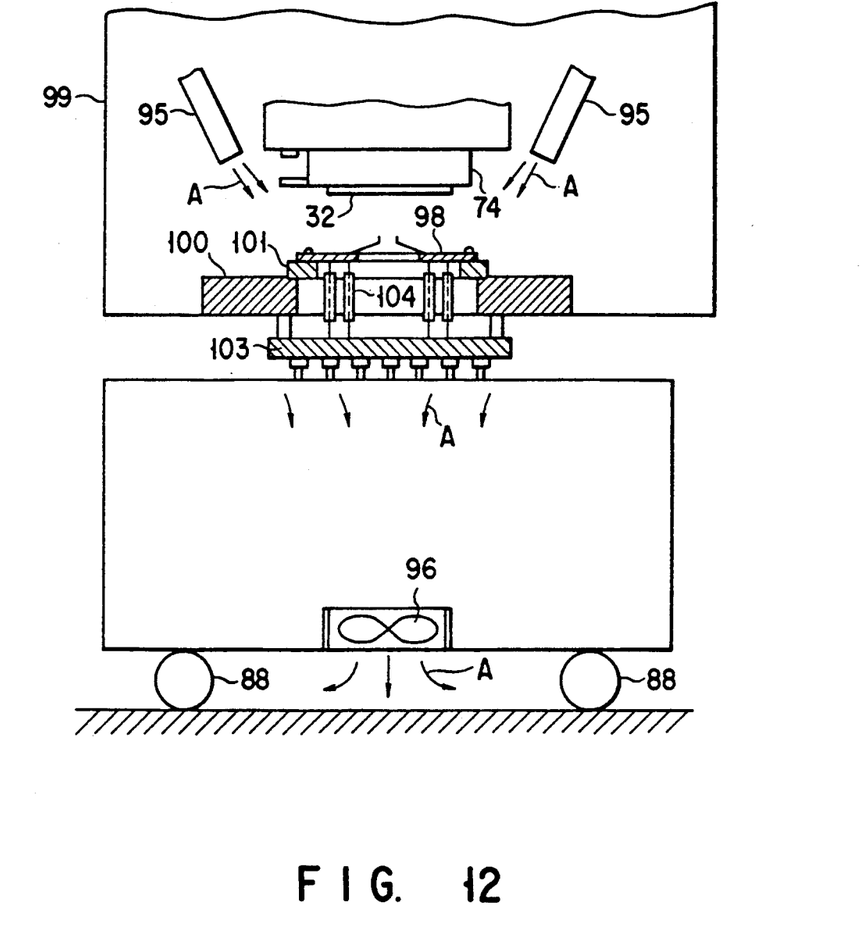
FIG. 12 is a view showing in more detail a part of the probe apparatus shown in FIG. 11.

The attaching manner of the probe card may be as shown in FIG. 12. More specifically, a probe card 98 is attached to the top of a plate 100 on a body of the probe apparatus through an insert ring 101 and then connected to a performance board 103 on the top of a test head 102 through coaxial cables 104. In short, the test head is designed to have the function of the performance board in it. However, this performance board function may be incorporated into the probe card. Namely, the probe card may also have the function of the performance board in which a relay for switching the electric connection of probes relative to the test head, an accuracy adjusting capacitor and others are included. When so arranged, the whole length of cables can be made shorter by that length of wirings which are needed for the performance board, and the delay of electric signals can be reduced considerably. This enables the measurement of electric characteristics to be achieved at a much higher frequency.

As described above, the probe apparatus according to the present invention makes it unnecessary to cause the heavy test head to be swung by the hinge system as seen in the conventional cases. This enables the probing of semiconductor wafers to be carried out with a higher efficiency. In addition, oxide film dust pieces cut off from electrode pad surfaces by probes can be prevented from adhering to the surface of each of the semiconductor wafers. Further, the convection of heat can be prevented, thereby preventing the quality of objects which are probed, from being lowered.

When the test head is attached directly to the tester, the delay of electric signals can be prevented and the characteristics examination can be carried out using electric signals of higher frequency.

Additional advantages and modifications will readily occur to those skilled in the art. Therefore, the invention in its broader aspects is not limited to the specific details, and representative devices, shows and described herein. Accordingly, various modifications may be made without departing from the spirit or scope of the general inventive concept as defined by the appended claims and their equivalents.

What is claimed is:

1. A probe apparatus, comprising:
a probe card having a plurality of probes;
a wafer holding means arranged sideward or upward of said probe card for holding a semiconductor wafer;
a test head electrically connected to the probes of the probe card; and
a tester electrically connected to said test head for detecting electrical characteristics of the semiconductor wafer based on an output signal generated from the semiconductor wafer;
wherein said wafer holding means is provided with an angle adjusting means for adjusting the direction of the semiconductor wafer such that a surface of the semiconductor wafer is adjusted so as to be maintained substantially parallel with a measuring face of the test head.

2. The probe apparatus according to claim 1, wherein the measuring face of the test head has the probe card mounted thereon and is inclined so as to form a predetermined angle with a horizontal plane.

3. The probe apparatus according to claim 1, wherein the test head and the tester are integrally housed within a single casing.

4. The probe apparatus according to claim 1, wherein the wafer holding means is provided with a suction means for holding the semiconductor wafer by suction force.

5. The probe apparatus according to claim 1, wherein said wafer holding means includes an alignment device having a camera and a capacitance sensor for detecting the positions of chips on said semiconductor wafer.

6. The probe apparatus according to claim 5, further comprising a control means for arithmetically calculating positional information of said chips relative to said probe card.

7. The probe apparatus according to claim 5, wherein image information is detected by said camera and is stored and used for comparison with subsequent image information obtained from subsequent semiconductor wafers mounted to said wafer holding means.

8. The probe apparatus according to claim 1, wherein said wafer holding means includes X and Y stages slidable along first and second pairs of guide rails, respectively, for moving said wafer holding means relative to said probe card.

9. The probe apparatus according to claim 1, wherein said wafer holding means includes a chuck for holding said semiconductor wafer and for moving said wafer reciprocatingly in directions toward or away from said probe card.

10. The probe apparatus according to claim 9, wherein a reference position member is projected from a side portion of said chuck for enabling the detection of a position of said semiconductor wafer relative to said probe card.

* * * * *